United States Patent [19]

Hallen

[11] 3,924,198

[45] Dec. 2, 1975

[54] TRANSISTOR AMPLIFIER HAVING SINGLE CONTROL TO SIMULTANEOUSLY ADJUST LEVEL INPUT RESISTANCE AND INPUT VOLTAGE

[75] Inventor: Thor Oscar Hallen, Aloha, Oreg.

[73] Assignee: Tektronix Inc., Beaverton, Oreg.

[22] Filed: Aug. 12, 1971

[21] Appl. No.: 171,244

[52] U.S. Cl. .......... 330/32; 330/40

[51] Int. Cl.$^2$ .......... H03F 3/04

[58] Field of Search .......... 330/40, 32

[56] References Cited

UNITED STATES PATENTS

| | | | |
|---|---|---|---|
| 2,747,111 | 5/1956 | Koch | 330/40 X |
| 3,237,002 | 2/1966 | Patmore | 235/184 |
| 3,374,442 | 3/1968 | Griffin | 330/40 |

FOREIGN PATENTS OR APPLICATIONS

| | | | |
|---|---|---|---|
| 1,093,415 | 11/1960 | Germany | 330/32 |

*Primary Examiner*—Nathan Kaufman
*Attorney, Agent, or Firm*—Klarquist, Sparkman, Campbell, Leigh, Hall & Whinston

[57] ABSTRACT

A transistor amplifier is described in which the input resistance and the quiescent D.C. input voltage level are maintained at predetermined values regardless of the beta current gain of the bipolar transistor by a compensation means having a single control. The compensation means includes a fixed base resistor connected at one terminal to the base input source of D.C. compensation current which are connected in common to the other terminal of the fixed base resistor. The variable base resistor functions as the control for simultaneous adjustment of the input resistance to the value of the fixed base resistor and adjustment of the input voltage level of such transistor amplifier to zero. This is achieved by applying a D.C. compensation current to such common connection which is equal to the emitter bias current times the ratio of the emitter resistance divided by the fixed base resistor of such transistor.

12 Claims, 2 Drawing Figures

THOR OSCAR HALLEN
*INVENTOR*

*BY*
*BUCKHORN, BLORE, KLARQUIST & SPARKMAN*
*ATTORNEYS*

TRANSISTOR AMPLIFIER HAVING SINGLE CONTROL TO SIMULTANEOUSLY ADJUST INPUT RESISTANCE AND INPUT VOLTAGE LEVEL

BACKGROUND OF THE INVENTION

The subject matter of the present invention relates generally to transistor amplifiers and in particular to such amplifiers having a compensation means whereby the input resistance and the input voltage level of the transistor may be simultaneously adjusted by single control to maintain them at the same predetermined values regardless of changes in the beta current gain of the transistor. The transistor amplifier of the present invention is especially useful when employed in the vertical amplifier system of a cathode ray oscilloscope.

Input amplifiers for oscilloscopes and other measuring devices must have an input resistance and a D.C. input voltage level which are maintained constant regardless of differences in the beta current gain of the bipolar transistors employed in such amplifier to prevent distortion of the signal transmitted through such amplifier. Thus, any changes in the input resistance causes undue loading of the signal source connected thereto. Also, the quiescent D.C. voltage level at the input of the amplifier must be held at zero volts so that the signal is free of any offset voltage relative to ground. These requirements are extremely difficult to meet because both the input resistance and D.C. base current (and therefore its input voltage level) of a bipolar transistor vary with its beta current gain. Previously, these two problems were solved separately during calibration of the oscilloscope by the adjustment of different controls which are interactive so that adjustment of one control, for example, to set the proper input resistance, also changed the D.C. input voltage level from the proper value set by the other control to a wrong value. As a result, the operator had to adjust one control and then adjust the other control back and forth gradually reducing the errors in both input resistance and input voltage level which was very difficult and time consuming. The present invention reduces the calibration time of the amplifier greatly because it enables a single control to simultaneously adjust both the input resistance and the input voltage level simultaneously.

It is, therefore, one object of the present invention to provide an improved transistor amplifier whose input resistance and quiescent D.C. input voltage level can be easily maintained at the same predetermined values regardless of changes in the current gain of the transistor.

Another object of the invention is to provide such an amplifier in which both the input resistance and input voltage level are adjusted simultaneously by a single control to reduce the calibration time of such amplifier.

A further object of the invention is to provide such an amplifier in which the control is provided by a variable base resistor connected between ground and a common terminal at the output of a source of D.C. compensation current and one end of a fixed base resistor whose other terminal is connected to the base of the transistor.

Still another object of the present invention is to provide such a transistor amplifier in which the input resistance is maintained equal to the value of the fixed base resistor and the input voltage level is maintained at zero volts by adjusting the variable base resistor if a D.C. compensation current is applied to the common terminal which is equal to the emitter bias current multiplied by the ratio of the emitter resistance divided by the fixed base resistor of such transistor.

A still further object of the invention is to provide such an amplifier with a push-pull output or with a single ended output.

BRIEF DESCRIPTION OF THE DRAWINGS

Other objects and advantages of the present invention will be apparent from the following detailed description of certain preferred embodiments thereof and from the attached drawings of which.

DESCRIPTION OF PREFERRED EMBODIMENT

Figure 1:
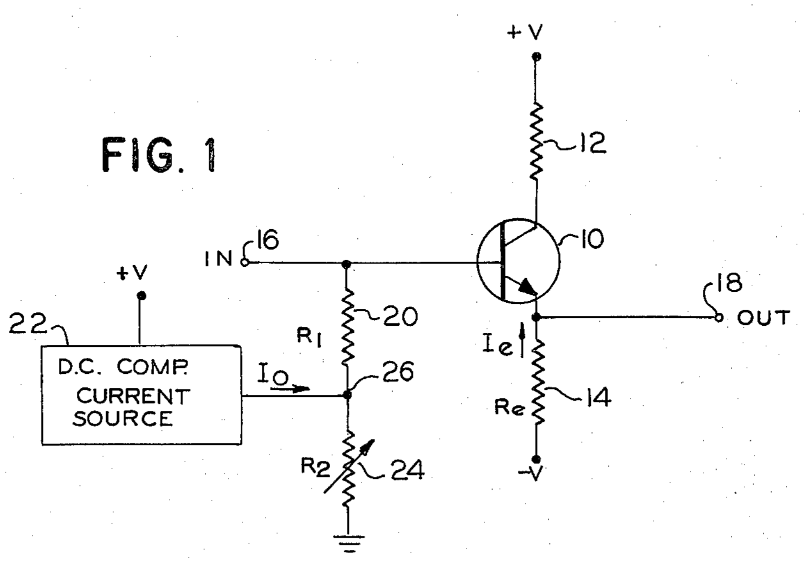
FIG. 1 is a schematic diagram of one embodiment of a transistor amplifier made in accordance with the present invention.
Figure 2:
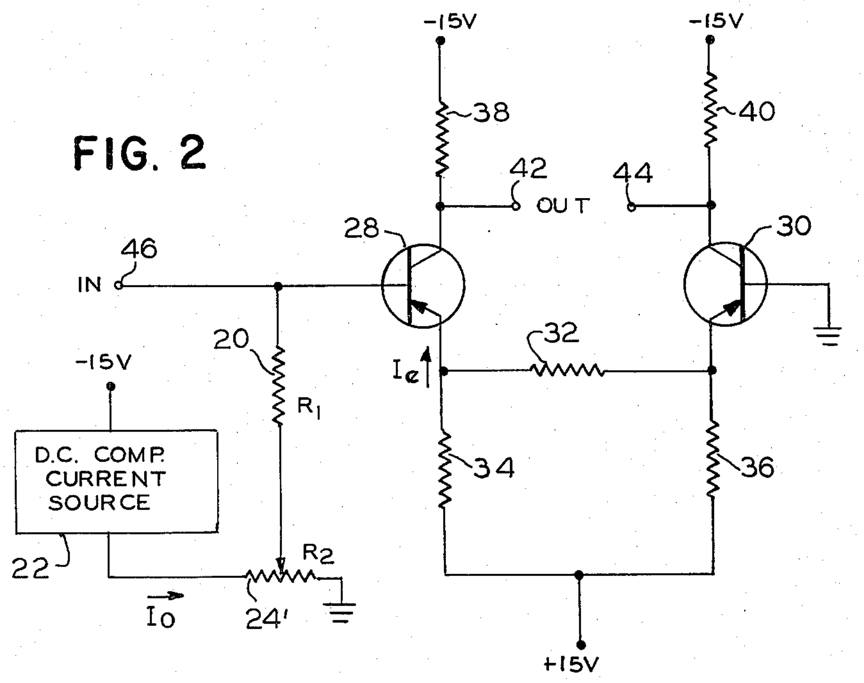
FIG. 2 is a schematic diagram of another embodiment of the transistor amplifier circuit of the present invention having a push-pull output.

As shown in FIG. 1, a single ended transistor amplifier made in accordance with the present invention includes a bipolar transistor 10 of the NPN type having its collector connected through a collector resistor 12 to a source of positive D.C. supply voltage. The emitter of transistor 10 is connected through an emitter resistor 14 to a source of negative D.C. supply voltage, and its base is connected to a signal input terminal 16 whose D.C. voltage level is maintained at zero volts so that such transistor is quiescently conducting. An output terminal 18 may be connected to the emitter of transistor 10 to provide an emitter follower amplifier. However, it is also possible to connect the output terminal to the collector of transistor 10 to provide a common emitter amplifier, as shown in FIG. 2.

An emitter bias current, $I_e$, flows through the emitter of transistor 10 and causes a corresponding base current, $I_b$, to flow in such transistor, such base current being equal to $I_e/(B+1)$, where B is the beta current gain of the transistor. This D.C. base current tends to produce a D.C. voltage offset at input terminal 16 due to the voltage drop across a fixed first base resistor 20 connected between the base of transistor 10 and a variable second base resistor 24. In order to compensate for this voltage drop and maintain the quiescent D.C. voltage level on input terminal 16 at zero volts, a D.C. compensating current $I_o$ is applied to the common terminal 26 of the second base resistor 24 and the first base resistor 20 by a D.C. compensating current source 22 connected to a positive D.C. supply voltage. As a result of the compensation current $I_o$, a positive D.C. voltage is produced on the lower terminal of the first base resistor 20 of the proper value so that the voltage drop produced by the base current flowing through resistor 20 reduces the voltage at the upper terminal of such resistor to zero. Since the value of the base current depends upon the beta current gain of transistor 10, the compensating current $I_o$ must be adjusted to compensate for changes in such current gain. This is achieved by adjustment of the second base resistor 24 which forms a current divider with the first base resistor 20.

It has been found that the second base resistor 24 can also be used to adjust the total input resistance of the transistor amplifier seen at input terminal 16 to maintain such input resistance equal to the first base resistance $R_1$ regardless of changes in beta of the transistor 10. This simultaneous adjustment of input resistance and input voltage level is possible if the compensation current $I_o$ is made equal to the emitter bias current $I_e$ times the ratio of the emitter resistance $R_e$ divided by the first base resistance $R_1$, or $I_o = I_e R_e/R_1$.

The critical relationship of $I_o = I_e R_e/R_1$ is derived as follows:

The input resistance, $R_{in}$, at input terminal 16 is equal to the parallel resistance of the equivalent emitter resistance $(B+1)R_e$ and the total base resistance, $R_1+R_2$, and is given by:

$$R_{in} = \frac{(B+1)R_e \times (R_1 + R_2)}{(B+1)R_e + (R_1 + R_2)}$$

Since the input resistance, $R_{in}$, is made equal to $R_1$ by adjustment of $R_2$, $$R_{in} = R_1 = \frac{(B+1)R_e \times (R_1 + R_2)}{(B+1)R_e + (R_1 + R_2)} \qquad \text{Formula 1}$$

The total quiescent D.C. current, $I_{in}$, at input terminal 16 due to the base current of transistor 10 and the compensation current, $I_o$, of source 22 is given by:

$$I_{in} = \frac{I_e}{B+1} - \frac{I_oR_2}{R_1+R_2}$$

Since the input current, $I_{in}$, is made equal to zero by adjustment of $R_2$ to provide the input terminal 16 with a quiescent D.C. voltage level of zero volts, $$I_{in} = O = \frac{I_e}{B+1} - \frac{I_oR_2}{R_1+R_2} \qquad \text{Formula 2}$$

Rewrite formula 1 as:

$R_1[R_1 + R_2 + R_e(B+1)] = (B+1)R_e(R_1 + R_2)$, or $R_1^2 + R_1R_2 = (B+1)\,[R_e(R_1+R_2) - R_1R_e]$, or $$\frac{R_1^2 + R_1R_2}{R_e\,(R_1+R_2) - R_1R_e} = B + 1 \qquad \text{Formula 3}$$

Rewrite formula 2 as:

$$\frac{R_1+R_2}{I_oR_2} = \frac{B+1}{I_e}, \text{ or}$$

$$\frac{I_e\,(R_1+R_2)}{I_oR_2} = B + 1 \qquad \text{Formula 4}$$

Substitute the left term of formula 3 for B + 1 in formula 4 and simplify as follows:

$$\frac{R_1^2 + R_1R_2}{R_e\,(R_1+R_2) - R_1R_e} = \frac{I_e\,(R_1+R_2)}{I_oR_2}, \text{ or}$$

$$I_oR_2 = \frac{I_e\,(R_1+R_2)\,[R_e(R_1+R_2) - R_1R_e]}{R_1^2 + R_1R_2}, \text{ or}$$

$$I_oR_2 = \frac{I_e\,[R_e(R_1+R_2) - R_1R_e]}{R_1}, \text{ or}$$

$$I_oR_2 = \frac{I_eR_eR_2}{R_1}, \text{ and}$$

$$I_o = \frac{I_eR_e}{R_1} \qquad \text{Formula 5.}$$

Another embodiment of the transistor amplifier circuit of the present invention is the paraphase amplifier shown in FIG. 2, which includes a pair of bipolar transistors 28 and 30 of PNP type which are connected together at their emitters through an emitter coupling resistor 32. The emitters of transistors 28 and 30 are also connected respectively through emitter bias resistors 34 and 36 to a source of positive D.C. supply voltage of, for example, +15 volts. The collectors of transistors 28 and 30 are respectively connected through load resistors 38 and 40 to sources of negative D.C. supply voltage of, for example, −15 volts. The collectors of transistors 28 and 30 are also connected respectively to output terminals 42 and 44. The base of transistor 28 is connected to a signal input terminal 46 while the base of transistor 30 may be grounded to provide a paraphase amplifier circuit having a push-pull output signal produced at output terminals 42 and 44. The base of transistor 28 is connected through the first base resistor 20 to the output of the D.C. compensation current source 22 in a similar manner to the circuit of FIG. 1. However, the variable second base resistor 24' is slightly different in that it is a potentiometer whose movable contact or tap is connected to the lower terminal of the first base resistor 20 and whose end terminals are connected respectively to ground and to the output of the current source 22. It should be noted that in the circuit of FIG. 2 the second base resistance, $R_2$, is that portion of the potentiometer resistance between its movable tap and ground. Also, the emitter resistance $R_e$ of the embodiment of FIG. 2 is equal to the total resistance connected to the emitter of transistor 28. Thus, if the same relationship of the $I_o = I_e R_e/R_1$, then adjustment of potentiometer 24' will simultaneously set the input resistance at input terminal 46 equal to the value of the first base resistor 20 and set the quiescent D.C. voltage level at such input terminal equal to zero regardless of changes in the beta of transistor 28, for example, due to the replacement of such transistor.

It will be obvious to those having ordinary skill in the art that many changes may be made in the details of the above described preferred embodiments of the present invention. For example, different types of transistors can be employed and the output can be taken from either the emitter or collector of such transistor. Therefore, the scope of the present invention should only be determined by the following claims.

I claim:

1. A transistor amplifier in which the improvement comprises:

a transistor having emitter, base and collector electrodes;

bias means for applying a D.C. emitter bias current to said emitter and causing a D.C. base current flow in said base;

an emitter resistance connected to said emitter;

an input signal terminal directly connected to said base to provide a D.C. input signal path to said base;

a first base resistor connected at one terminal to said base; and compensation means including resistance means connected between the other terminal of said first base resistor and a reference voltage for applying a D.C. compensation voltage to the other terminal of said first base resistor to compensate for the voltage drop produced across said first resistor by said base current;

said compensation means including a single control means for adjusting said compensation voltage in order to maintain the D.C. voltage level of said input terminal at predetermined value, and for simultaneously varying the resistance in series between said first resistor and ground in order to maintain the input resistance of said amplifier at a predetermined value, in spite of different current gains for said transistor.

2. An amplifier in accordance with claim 1 in which the transistor is a bipolar transistor and the compensation means includes a variable second base resistor providing said control connected between the other terminal of said first resistor and ground, and a source of D.C. compensation current connected at its output in common with said first and second base resistors to provide said compensation voltage.

3. An amplifier in accordance with claim 2, said compensation current is equal to said emitter current multiplied by the ratio of said emitter resistance divided by said first base resistor.

4. An amplifier in accordance with claim 2 in which the value of the input resistance of said transistor is maintained equal to said first resistor and the D.C. voltage level of said input terminal is maintained at zero volts.

5. An amplifier in accordance with claim 2 in which said second resistor is equal to $$\frac{R_1^2}{(B+1)\,R_e - R_1},$$

where $R_1$ is said first resistor, $R_e$ is said emitter resistance and B is the beta current gain of said transistor.

6. An amplifier in accordance with claim 1 having a single ended output, connected to the emitter of said transistor.

7. An amplifier in accordance with claim 1 including a second transistor and having push-pull outputs connected to different ones of the two transistors.

8. An amplifier in accordance with claim 7 in which the push-pull outputs are connected to the collectors of said two transistors.

9. An amplifier in accordance with claim 8 in which the two transistors have their emitters connected together through an emitter coupling resistor.

10. An amplifier in accordance with claim 9 in which the base of the second transistor is connected to ground to provide a paraphase amplifier circuit.

11. A transistor amplifier in which the improvement comprises:

a transistor having emitter, base and collector electrodes;

bias means for applying a D.C. emitter bias current to said emitter and causing a D.C. base current flow in said base;

an emitter resistance connected to said emitter;

an input signal terminal directly connected to said base;

a first base resistor connected at one terminal to said base; and compensation means including resistance means including a single adjustable control, for applying a D.C. compensation current to the other terminal of said first base resistor, said compensation current being equal to said emitter current multiplied by the ratio of said emitter resistance divided by said first base resistor, for providing an adjustable D.C. compensation voltage at said other terminal which is adjusted by said control to compensate for the D.C. bias voltage produced across said first resistor by said base current and is of opposite polarity to said bias voltage in order to maintain the D.C. voltage level of said input terminal at predetermined value, and for simultaneously varying the resistance in series between said first resistor and ground with said control in order to maintain the input resistance of said amplifier at a predetermined value in spite of different current gains for said transistor.

12. An amplifier in accordance with claim 11 in which said compensation voltage is equal in value to, but of opposite polarity, to that of the D.C. bias voltage produced on the base of said transistor.

* * * * *

UNITED STATES PATENT AND TRADEMARK OFFICE

CERTIFICATE OF CORRECTION

PATENT NO. : 3,924,198

DATED : December 2, 1975

INVENTOR(S) : Thor Oscar Hallen

It is certified that error appears in the above-identified patent and that said Letters Patent are hereby corrected as shown below:

On the cover page, left hand column, in the title, after "adjust" and before "input", omit "level", and after "voltage" insert --level--; and On the cover page, right hand column, in the abstract, line 7, after "input" and before "source" should be inserted --of the transistor, and a variable base resistor and a--.

Signed and Sealed this

*second* Day of *March 1976*

[SEAL]

*Attest:*

RUTH C. MASON
*Attesting Officer*

C. MARSHALL DANN
*Commissioner of Patents and Trademarks*